(12) United States Patent
Augustine

(10) Patent No.: US 6,396,420 B1
(45) Date of Patent: May 28, 2002

(54) DELTA COMPRESSION OF FLOATING POINT COORDINATE DATA

(75) Inventor: Davis C. Augustine, San Rafael, CA (US)

(73) Assignee: Autodesk, Inc., San Rafael, CA (US)

( * ) Notice: Subject to any disclaimer, the term of this patent is extended or adjusted under 35 U.S.C. 154(b) by 0 days.

(21) Appl. No.: 09/259,111

(22) Filed: Feb. 26, 1999

(51) Int. Cl.[7] .................................................. H03M 7/00
(52) U.S. Cl. ........................ 341/50; 341/87; 382/236
(58) Field of Search ........................... 341/87, 50, 65; 370/474, 477; 382/236, 246

(56) References Cited

U.S. PATENT DOCUMENTS 4,654,877 A * 3/1987 Shimoni et al. ............ 382/236
4,899,147 A * 2/1990 Shiavo et al. ................ 341/60
5,293,379 A * 3/1994 Carr ............................ 370/474

FOREIGN PATENT DOCUMENTS

EP          0 646 887 A2 *  4/1995

* cited by examiner

*Primary Examiner*—Peguy JeanPierre
*Assistant Examiner*—Jean Bruner JeanGlaude
(74) *Attorney, Agent, or Firm*—Gates & Cooper LLP (57) ABSTRACT

A method, apparatus, article of manufacture for compressing a series of data values is describe. Common and non-common digits between two successive data values are identified, and a compressed data value from the non-common digits and a code identifying the common digits is formed. Compressed data values are decompressed by substituting the digits common between a first and a second data value into the first compressed data value according to the code.

31 Claims, 12 Drawing Sheets

| Value (decimal) | hexadecimal representation (low mem     high mem) |
|---|---|
| 2.0 | 00 00 00 00 00 00 00 40 |
| 2.1 | cd cc cc cc cc cc 00 40 |
| 2.2 | 9a 99 99 99 99 99 01 40 |
| 3.0 | 00 00 00 00 00 00 08 40 |
| 3.10 | cd cc cc cc cc cc 08 40 |
| 3.1000001 | 1a c6 38 da cc cc 08 40 |
| 3.12 | f6 28 5c 8f c2 f5 08 40 |
| 4.0 | 00 00 00 00 00 00 10 40 |

```
                   Sequential Coordinate Compression algorithm
//
// Copyright 1998 Autodesk, Inc.
//

// The function which compresses vertexes and writes them out.  The
// first argument rVal, is the x, y or z value to be written.  The
// second argument, rPrevVal, is the previous x, y or z value that
// was written.  So we compress the current value relative to the
// previous value.
//
// from db/imp/src/memfiler.cpp
//
Acad::ErrorStatus AcDbMemoryDwgFiler::writeCompressedDouble(const double & rVal,
                                                    const double & rPrevVal)
{
    // compress with a 2-bit code
    // 0 = values are same, write 0 bytes
    // 1 = high 32 bits are same, write 4 bytes
    // 2 = high 16 bits are same, write 6 bytes
    // 3 = no bits are same, write 8 bytes
    Acad::ErrorStatus es;
    DWORD hidiff = *((DWORD *)&rVal + 1) ^ *((DWORD *)&rPrevVal + 1);
    if (hidiff == 0) {
        if (*(DWORD *)&rVal == *(DWORD *)&rPrevVal)
            es = mMemoryBuffer.writeTwoBits(0); // code 0: values are the same
        else {
            mMemoryBuffer.writeTwoBits(0x40);   // code 1: high 32 bits are the same
            es = mMemoryBuffer.write32Bits(*(DWORD *)&rVal);
        }
    }
    else if (!(hidiff & 0xffff0000)) {
        mMemoryBuffer.writeTwoBits(0x80);       // code 2: high 16 bits are the same
        mMemoryBuffer.write16Bits(*((unsigned short *)&rVal + 2));
        es = mMemoryBuffer.write32Bits(*(DWORD *)&rVal);
    }
    else {
        ASSERT(hidiff & 0xffff0000);
        mMemoryBuffer.writeTwoBits(0xc0);       // code 3: no bits are the same
        es = mMemoryBuffer.write64Bits(&rVal);
    }
    return es;
}
```

FIG. 10A

```
// The function which reads compressed vertex values and expands them
// to their original values.  The rVal argument is the destination for
// the final expanded value.  The rPrevVal argument is the previous
// value which was expanded.  So, rVal, is expanded relative to
// rPrevVal.
//
// from db/imp/src/memfiler.cpp
//
//
Acad::ErrorStatus AcDbMemoryDwgFiler::readCompressedDouble(double & rVal,
                                                    const double & rPrevVal)
{
    // read values compressed by writeCompressedDouble()
    // 0 = values are same, write 0 bytes
    // 1 = high 32 bits are same, write 4 bytes
    // 2 = high 16 bits are same, write 6 bytes
    // 3 = no bits are same, write 8 bytes
    unsigned char code = 0;
    mMemoryBuffer.readTwoBitsInline(code);

// mem filer writes most significant bits first
    ASSERT(!(code & 0x3f));
    switch (code >> 6) {
      case 0:
        rVal = rPrevVal;
        return eOk;
      case 1:
        *((DWORD *)&rVal + 1) = *((DWORD *)&rPrevVal + 1);
        return mMemoryBuffer.read32Bits((DWORD *)&rVal);
      case 2:
        *((unsigned short *)&rVal + 3) = *((unsigned short *)&rPrevVal + 3);
        mMemoryBuffer.read16Bits((unsigned short *)&rVal + 2);
        return mMemoryBuffer.read32Bits((DWORD *)&rVal);
      case 3:
        return mMemoryBuffer.read64Bits(&rVal);
      default:
        break;
    }
    ASSERT(false);
    return eInvalidInput;
}
```

FIG. 10B

```
// The write loop for a 2-d polyline.  Note that each x and y coordinate
// is compressed relative to the previous x or y coordinate.  The first
// coordinate (where i == 0) is written out as a full 64-bit value, since
// there is no previous coordinate which it can be compressed against.
//
// from db/imp/src/dbpli.cpp
// const AcGePoint2d *pPrevPt;

for (unsigned int i = 0; i < mBuf.numVerts(); i++) {
        const AcGePoint2d *pPt = mBuf.getPointAt(i);
        if (i == 0) {
            ((AcDbMemoryDwgFiler *)filer)->write64Bits(&pPt->x);
            es = ((AcDbMemoryDwgFiler *)filer)->write64Bits(&pPt->y);
        }
        else {
            ((AcDbMemoryDwgFiler *)filer)->writeCompressedDouble(pPt->x, pPrevPt->x);
            es = ((AcDbMemoryDwgFiler *)filer)->writeCompressedDouble(pPt->y, pPrevPt->y);
        }
        pPrevPt = pPt;
    }

// The read loop for a 2-d polyline.  Note that each x and y coordinate
// is compressed relative to the previous x or y coordinate.  The first
// coordinate (where i == 0) is read in as a full 64-bit value, since
// there is no previous coordinate which it can be compressed against.
//
// from db/imp/src/dbpli.cpp
//

AcGePoint2d *pPt = mBuf.getRawPointPtr(numPoints);
    const AcGePoint2d *pPrevPt;

for (unsigned i = 0; i < numPoints; i++, pPt++) {
        if (i == 0) {
            ((AcDbMemoryDwgFiler *)filer)->read64Bits(&pPt->x);
            es = ((AcDbMemoryDwgFiler *)filer)->read64Bits(&pPt->y);
        }
        else {
            ((AcDbMemoryDwgFiler *)filer)->readCompressedDouble(pPt->x, pPrevPt->x);
            es = ((AcDbMemoryDwgFiler *)filer)->readCompressedDouble(pPt->y, pPrevPt->y);
        }
        pPrevPt = pPt;
    }
```

DELTA COMPRESSION OF FLOATING POINT COORDINATE DATA

BACKGROUND OF THE INVENTION

1. Field of the Invention

The present invention relates generally to computer implemented systems for storing and retrieving data and in particular, to a method and apparatus for delta compression floating point coordinate data

2. Description of the Related Art

Today's software applications are often called upon to store and retrieve vast amounts of data. This is particularly so in software applications used to create art, technical drawings, schematics and the like, because these data files include data describing a large number of lines and curves. In many instances, the data file size can become quite large, in some cases exceeding the capacity of ordinary floppy disks, and requiring a substantial amount of time to read and write the data to the media In many instances, the data to be stored or retrieved for such applications comprises a plurality of data values describing a series of closely-spaced data points expressed in Cartesian coordinates. In such cases, each data value often exhibits a high degree of correlation with data values for nearby data points. Further, as the number of data points in a given line or curve increase, the correlation between a data value for a particular data point and the next corresponding data point increase. What is needed is a simple, easy to implement method of compressing data files having inter-correlated data values. The present invention satisfies that need.

SUMMARY OF THE INVENTION

To address the requirements described above, the present invention discloses a method, apparatus, article of manufacture, and a memory structure for delta compression of floating point coordinate data. This allows the compression of sequential drawing coordinates in a file, resulting in the usage of less storage space and faster read and write access to the data.

The method begins by segmenting a first data value into common digits and non-common digits. The common digits are the digits in the first data value that have the same value as the corresponding digits in a second data value (typically, the data value preceding the first data value). A code identifying the common digits is then generated, and stored along with the common digits for later retrieval. This represents the compressed first data value.

The compressed data is decompressed by performing the steps of reading the compressed data value and the code (which identifies the digits that are common between the first data value and a second data value), and substituting the digits common between the first data value and the second data value according to the code.

In one embodiment, the non-compressed data values are drawing coordinates expressed as IEEE (Institute of Electrical and Electronic Engineers) double-precision values, stored in INTEL byte order. The (x,y) coordinates of each data point are compared to the previous data point's (x,y) coordinates to determine whether the values have zero, two, four, or eight bytes in common. A two-bit code indicating which of these cases was encountered is written, followed by the actual bytes that are different. Because of the way IEEE double-precision values are expressed, the data values are effectively compressed when the data values are close to one another.

The apparatus comprises means for performing the method steps described above. In each case, the means for performing these steps may include, for example a computer, a special purpose processor, or a combination of computers connected via an intranet, the Internet, or similar communication path. The article of manufacture comprises a data storage device tangibly embodying instructions to perform the method steps described above.

BRIEF DESCRIPTION OF THE DRAWINGS

Referring now to the drawings in which like reference numbers represent corresponding parts throughout.

DETAILED DESCRIPTION OF PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Hardware Environment

Figure 1:
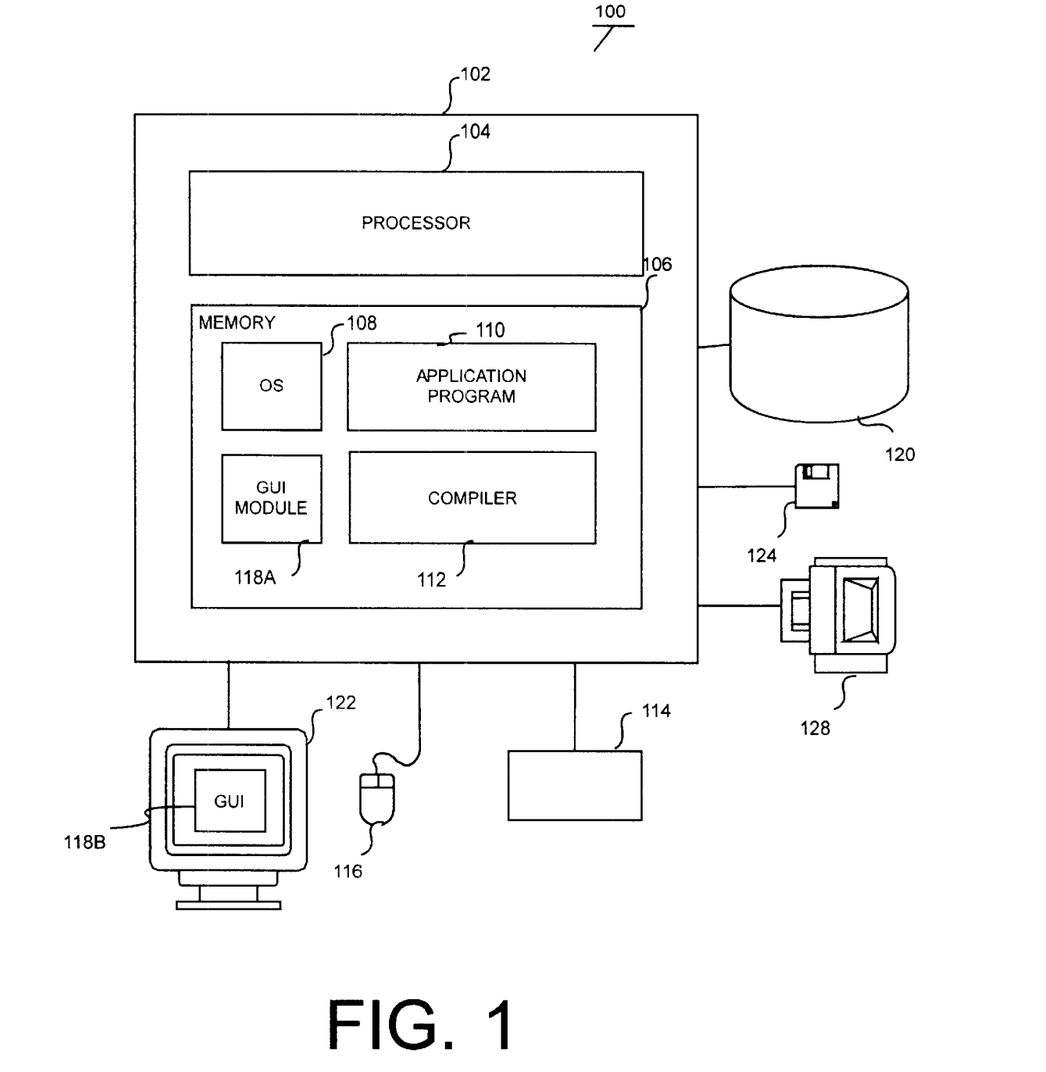
FIG. 1 is a block diagram showing an exemplary hardware environment for practicing the present invention.

FIG. 1 illustrates an exemplary computer system 100 that could be used to implement the present invention. The computer 102 comprises a processor 104 and a memory, such as random access memory (RAM) 106. The computer 102 is operatively coupled to a display 122, which presents images such as windows to the user on a graphical user interface 118B. The computer 102 may be coupled to other devices, such as a keyboard 114, a mouse device 116, a printer 128, scanner, etc. Of course, those skilled in the art will recognize that any combination of the above components, or any number of different components, peripherals, and other devices, may be used with the computer 102.

Generally, the computer 102 operates under control of an operating system 108 stored in the memory 106, and interfaces with the user to accept inputs and commands and to present results through a graphical user interface (GUI) module 118A. Although the GUI module 118A is depicted as a separate module, the instructions performing the GUI functions can be resident or distributed in the operating system 108, the application program 110, or implemented with special purpose memory and processors. The computer 102 also implements a compiler 112 which allows an application program 110 written in a programming language such as COBOL, C++, FORTRAN, or other language to be translated into processor 104 readable code. After completion, the application 110 accesses and manipulates data stored in the memory 106 of the computer 102 using the relationships and logic that was generated using the compiler 112.

In one embodiment, instructions implementing the operating system 108, the computer program 110, and the compiler 112 are tangibly embodied in a computer-readable medium, e.g., data storage device 120, which could include one or more fixed or removable data storage devices, such as a zip drive, floppy disc drive 124, hard drive, CD-ROM drive, tape drive, etc. Further, the operating system 108 and the computer program 110 are comprised of instructions which, when read and executed by the computer 102, causes the computer 102 to perform the steps necessary to implement and/or use the present invention. Computer program 110 and/or operating instructions may also be tangibly embodied in memory 106 and/or data communications devices, thereby making a computer program product or article of manufacture according to the invention. As such, the terms "article of manufacture" and "computer program product" as used herein are intended to encompass a computer program accessible from any computer readable device or media.

Those skilled in the art will recognize many modifications may be made to this configuration without departing from the scope of the present invention. For example, those skilled in the art will recognize that any combination of the above components, or any number of different components, peripherals, and other devices, may be used with the present invention.

IEEE Double Precision Values

Figure 2A:
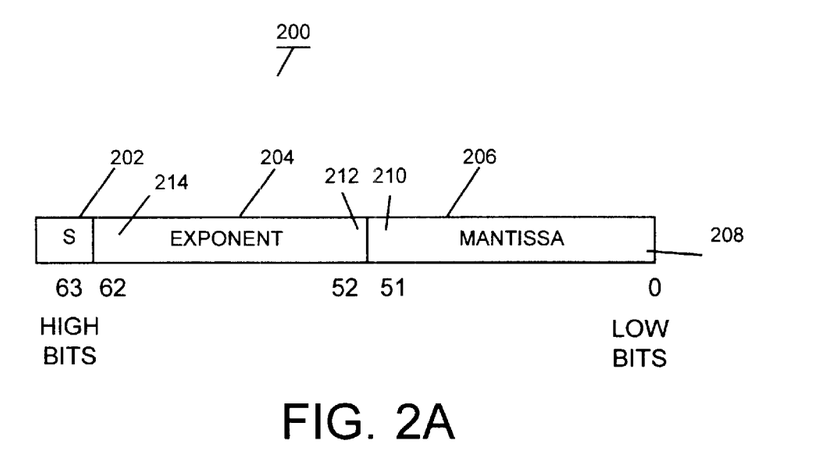
FIG. 2A is a diagram showing a representation of a data value in an IEEE double-precision format.
Figure 2B:
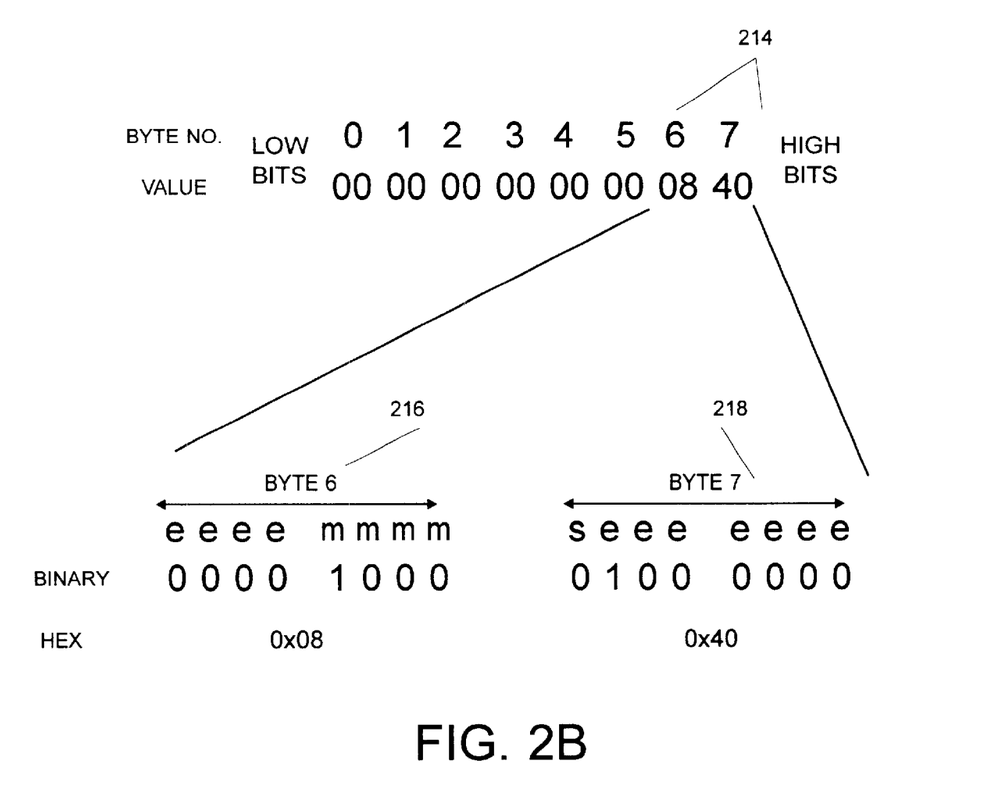
FIG. 2B is a diagram showing a representation of a data value as a series of hexadecimal digits in an IEEE double-precision, INTEL reverse order format.

FIG. 2A is a diagram illustrating a 64-bit double precision data value 200 expressed according to the IEEE standard. The value is expressed by a plurality of digits. In the example shown in FIG. 2, the word is expressed in a binary word, and each digit is either a "1" or a "0". The digits include a sign bit 202, an 11-bit exponent 204 (bits 52–62), and a 52-bit mantissa 206. The mantissa 206 is also referred to as the "significant." Bit 0 208 (bit 0 in byte 0) is the least significant bit in the significant 206, while bit 51 210 (bit 3 in byte 6) is the most significant bit of the significant 206. Bit 52 212 (bit 4 in byte 6) is the least significant bit of the exponent 204, and bit 62 (bit 6 in byte 7) is the most significant bit of the exponent 204. In accordance with the IEEE standard, the exponent is expressed by an 11-bit biased value such that the actual exponent is obtained by subtracting 1023 (3ff hexadecimal) from the value of bits 62–52. Leading "1s" in the significant 206 are implied FIG. 2B presents a representation of the decimal value of 3.0 when expressed according to the IEEE double-precision and INTEL conventions. The decimal value of 3.0 can be expressed as a double-precision binary number as $(1 \times 2^0) + (1 \times 2^{-1}) \cdot 2^1$ or $1.00000000000 \times 2^1$. When so expressed, the numeric exponent is "1." Biasing the numeric exponent according to the IEEE standard (by adding 1023), yields an exponent 204 of 1024. The significant is 1.100000000000 (1.1 followed by 51 zeros).

When the numeric exponent is biased according to the IEEE standard (by adding $1023_{10}$ or $400_{hex}$, the leading "1" in the significant 206 is dropped, and the number is expressed as a series of hexadecimal digits in reverse order (the most significant bits and the least significant bits have been reversed), the decimal value of 3.1 is represented as "00 00 00 00 00 00 08 40". The most significant digits 214 can be represented as byte six 216 and byte seven 218. The binary digits corresponding to byte six 216 and byte seven 218 are labeled with an "e" where the digit is in the double precision number exponent 204, an "m" where the digit is in the double precision number mantissa (or significant) 206, and an "s" where the digit is the sign digit 202.

Figure 3:
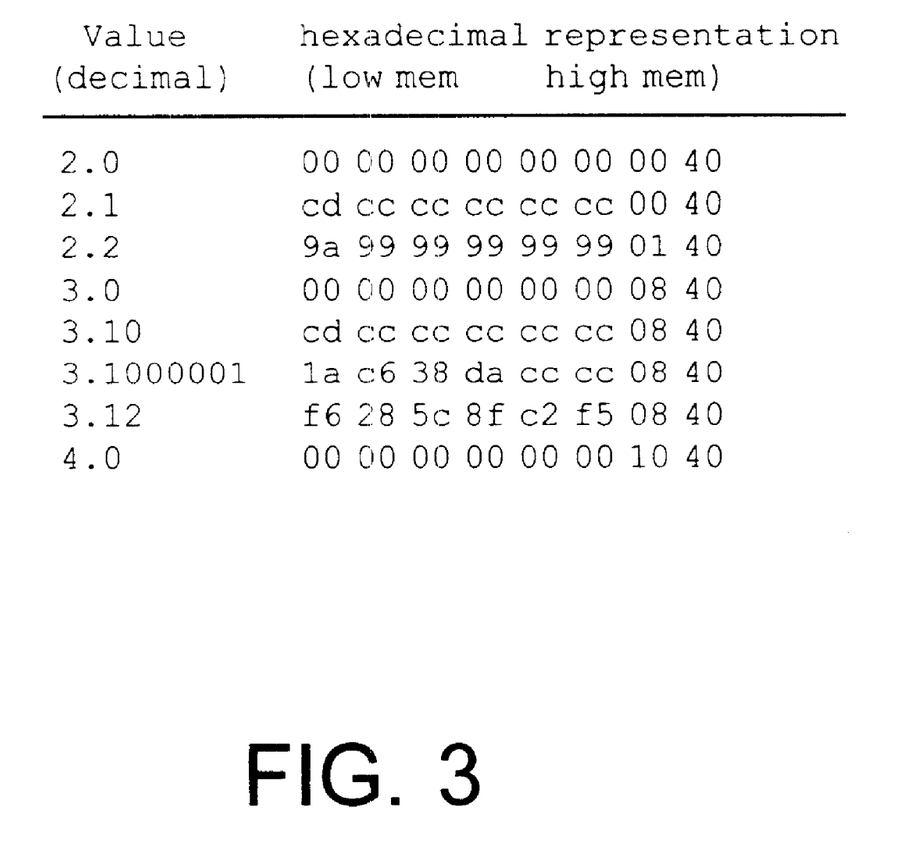
FIG. 3 is a diagram showing a representation of other values in an IEEE double precision, INTEL reverse order format.

FIG. 3 is a diagram presenting further examples of double-precision hexadecimal data values expressed according to the IEEE and INTEL formats.

Data Compression

Figure 4:
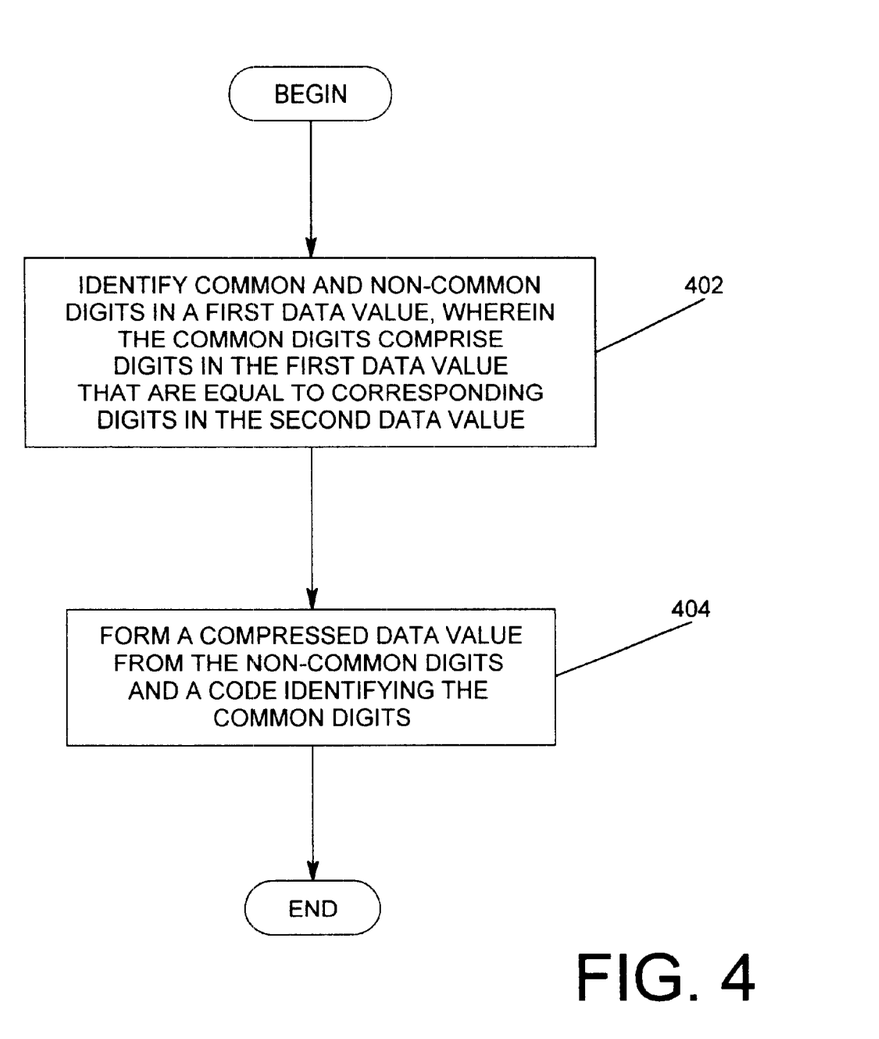
FIG. 4 is a flow chart presenting an illustrative example of process steps used in compressing a data value represented by a plurality of digits.

FIG. 4 is a flow chart showing exemplary operations used to compress a data value. The process begins by identifying common and non-common digits in a first data value, as shown in block 202. The common digits comprise digits in the first data value that are equal to the corresponding digits in a second data value. Then, a compressed data value is formed from the non-common digits and a code identifying the common digits, as shown in block 204.

Figure 5:
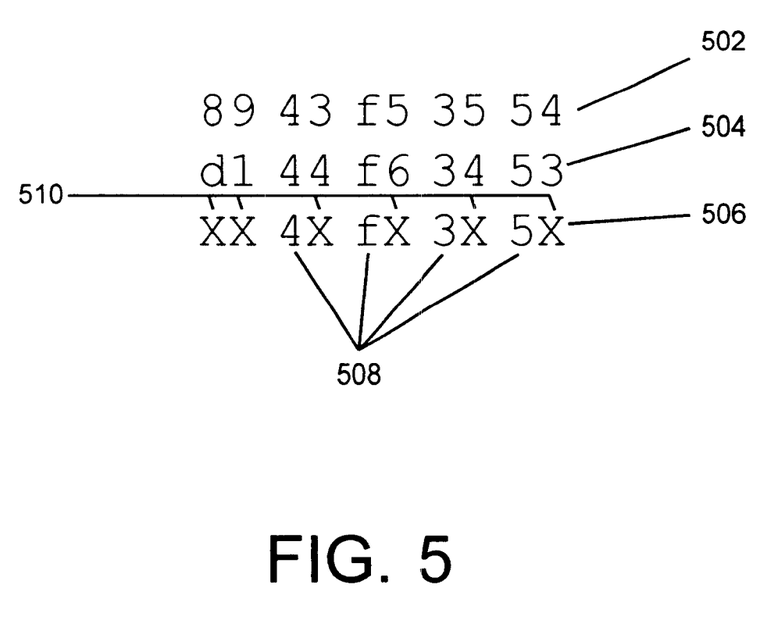
FIG. 5 is a diagram showing the identification of common and non-common digits in a value expressed in an IEEE double precision INTEL format.

FIG. 5 shows one embodiment of the present invention, wherein the bits that are common between the first data value and the second data value can be any of the bits within the two data values so long as bits of equal significance in the first data value and the second data value have equal values. Here, the first data value 502 and the second data value 504 are compared, resulting in the value 504, in which non-common data values 510 are indicated by an "X" and common data values 508 are indicated by the common value. In this example, none of the common data values are contiguous (i.e. adjacent to the next more or less significant bit).

Figure 6:
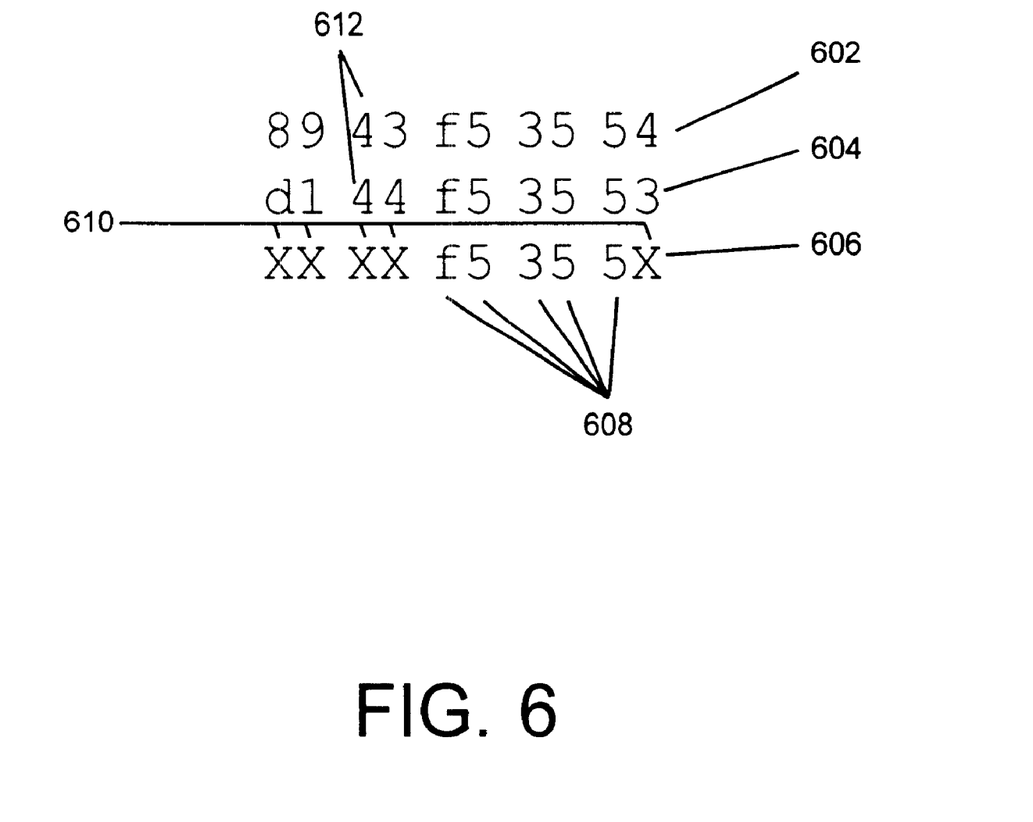
FIG. 6 is a diagram showing the identification of a contiguous set of N common digits in a value expressed in an IEEE double precision, INTEL format.

FIG. 6 is a diagram showing an application of another embodiment of the present invention in which the first and the second data values are compared to find a contiguous series of N digits common to both data values. In the illustrated example, a comparison between the first data value 602 and the second data value 604 results in a series of five contiguous bits 608 in the first data value 602 that have the same value as the corresponding contiguous bits in the second data value 604. Note that although value 612 is equal in the corresponding digits of the first data value 602 and the second data value, it is not contiguous with the five contiguous bits 608.

Figure 7:
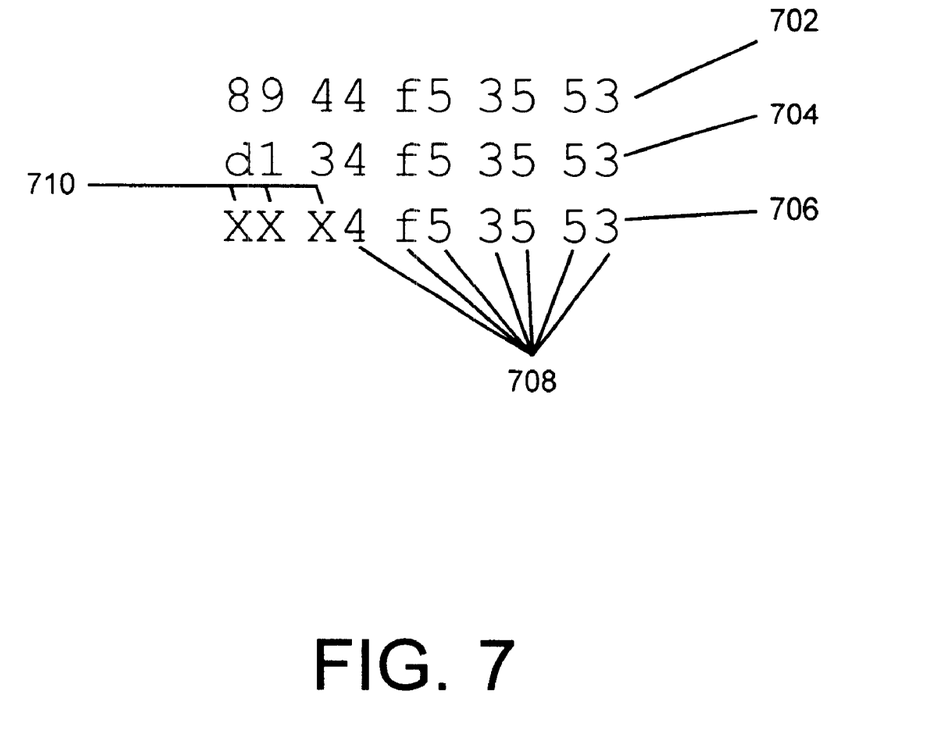
FIG. 7 is a diagram showing the identification of a contiguous set of N common digits in a value expressed in an IEEE double-precision INTEL format wherein the common digits begin at the most significant digit.

FIG. 7 is a diagram showing the application of another embodiment of the present invention in which the first and the second data values are compared to identify common and non-common bits. Here, the contiguous series of N digits common to both data values begin from the most significant digit. Since the beginning point of the digits common between the first data value 702 and the second data value 704 is known (it is always the most significant digit), the code identifying the common digits between the first data value 702 and the second data value 704 need only identify the number of digits common between the first and the second data values. In the example illustrated in FIG. 7, the common digits 708 between the first data value 702 and the second data value 704 include the seven most significant digits 708.

Figure 8:
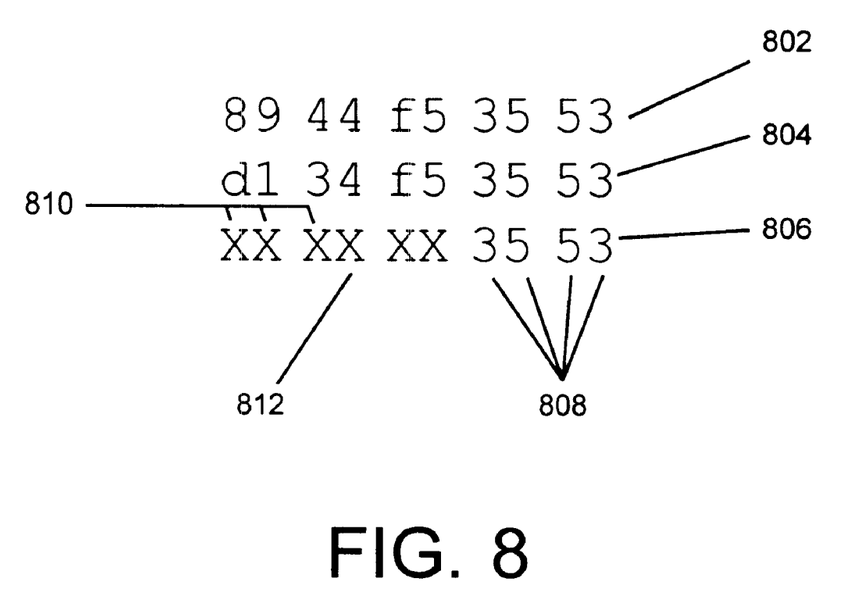
FIG. 8 is a diagram showing the identification of a contiguous set of N common digits, wherein the common digits begin at the most significant digit and the common digits are constrained to include either zero, two, four, or eight bytes.

FIG. 8 is a diagram showing the application of another embodiment of the present invention in which the first and the second data values are compared to identify common and non-common digits. In this embodiment, the contiguous series of N digits common to both data values begin from the most significant digit, and the number of common digits is constrained. In the illustrated example, the number of common bytes N in a data value with L bytes is constrained to be either zero, two, four, or eight bytes (i.e. either 0 or $2^k$ where k=1, 2, ..., L). In the illustrated example, there are seven bytes in common between the first data value 802 and the second data value 804, but since the number of common digits is constrained to zero, two, four, or eight bytes, only four bytes are reported to be common between the first and the second data value. By constraining the number of common digits to a number which is a power of two, the digits common to the first data value 802 and the second data value 804 can be determined by a simple two-bit binary code. Although this technique results in less data compression, it simplifies (and speeds up) the compression/decompression processing.

The data compression technique described in the foregoing takes advantage of the fact that floating point values that are near each other will have matching values in the most significant sixteen or thirty-two bits. In fact it is often the case that the first data value 802 and the second data value 804 will be equal to one another, and will match in all sixty-four bits.

Data Compression Example

To illustrate an application of the foregoing data compression technique, consider a case wherein a polyline has four points with the following coordinates:

$p_1(x,y)$=(2.0000000, 2.0000000)
$p_2(x,y)$=(2.0000000, 3.0000000)
$p_3(x,y)$=(3.0000000, 3.1000000)
$p_4(x,y)$=(3.1200000, 3.1000001)

After application of the foregoing data compression technique, the data written out is:

Note that since this is the first coordinate, no data compression is performed. The next data values are written out as described in Table 1 below:

TABLE 1

| Data Value | Code | Compressed Data Value | Comment |
|---|---|---|---|
| $p_1(x)$ = | | 00 00 00 00 00 00 00 40 (8 bytes) | Since $p_1(x)$ and $p_2(x)$, are the first coordinates, no data compression is performed |
| $p_2(x)$ = | | 00 00 00 00 00 00 00 40 (8 bytes) | |
| $p_2(x)$ = | 00 (2 bits) | | "00" code indicates that all digits are common, because $p_2(x) = p_1(x)$ |
| $p_2(y)$ = | 11 (2 bits) | 00 00 00 00 00 00 08 40 (8 bytes) | Because 3.0 and 2.0 do not compress |
| $p_3(x)$ = | 11 (2 bits) | 00 00 00 00 00 00 08 40 (8 bytes) | Because 3.0 and 2.0 do not compress |

TABLE 1-continued

| Data Value | Code | Compressed Data Value | Comment |
|---|---|---|---|
| $p_3(y)$ = | 10 (2 bits) | cd cc cc cc cc cc (6 bytes) | Because 3.12 and 3.0 have the most significant 16 bits in common |
| $p_4(x)$ = | 10 (2 bits) | f6 28 5c 8fc2 f5 (6 bytes) | Because 3.12 and 3.0 have the most significant 16 bits in common |
| $p_4(y)$ = | 01 (2 bits) | 1a c6 38 da (4 bytes) | Because 3.1000001 and 3.10 have the most significant 32 bits in common |

Without compression, storage of the foregoing data values would require sixty-four (8×2×4) bytes of memory. With the foregoing technique, only 49.5 bytes (8+8+8+8+6+6+4 bytes and 2+2+2+2+2+bits) are required.

Data Decompression

Figure 9:
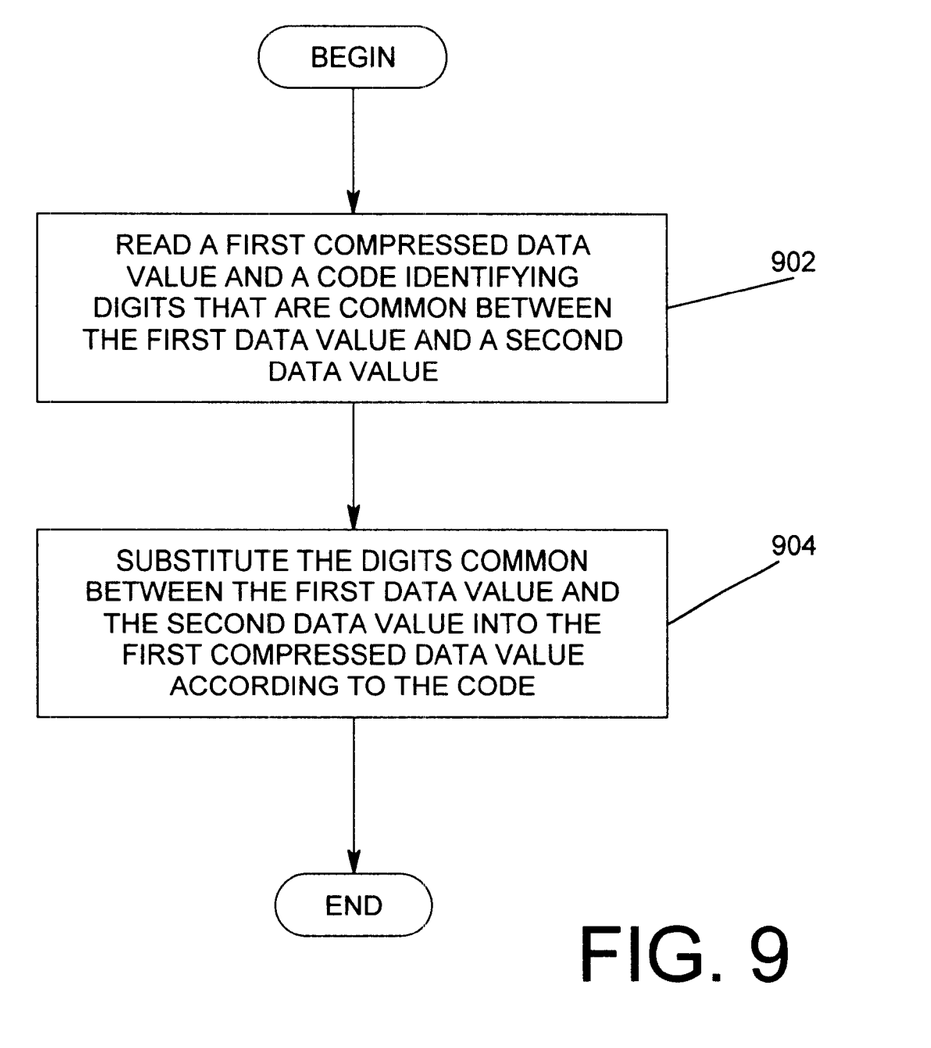
FIG. 9 is a flow chart presenting an illustrative example of process steps used in decompressing a data value.

FIG. 9 is a flow chart illustrating exemplary process steps used to decompress a data value that was compressed using the above-described technique. The process begins by reading a first compressed data value and one or more codes identify digits that are common between the first data value (in non-compressed form), and a second data value. This is shown in block 902. Then, the digits common between the first data value and the second data value are substituted into the first data value according to the code, as shown in block 904. In one embodiment, the first data value was compressed by identifying N contiguous digits, beginning with the most significant digit. In this case, the code uniquely identifies the common digits by providing the number of digits in common (since the fact that the digits were substituted beginning at the most significant digit is known).

Figure 10A:
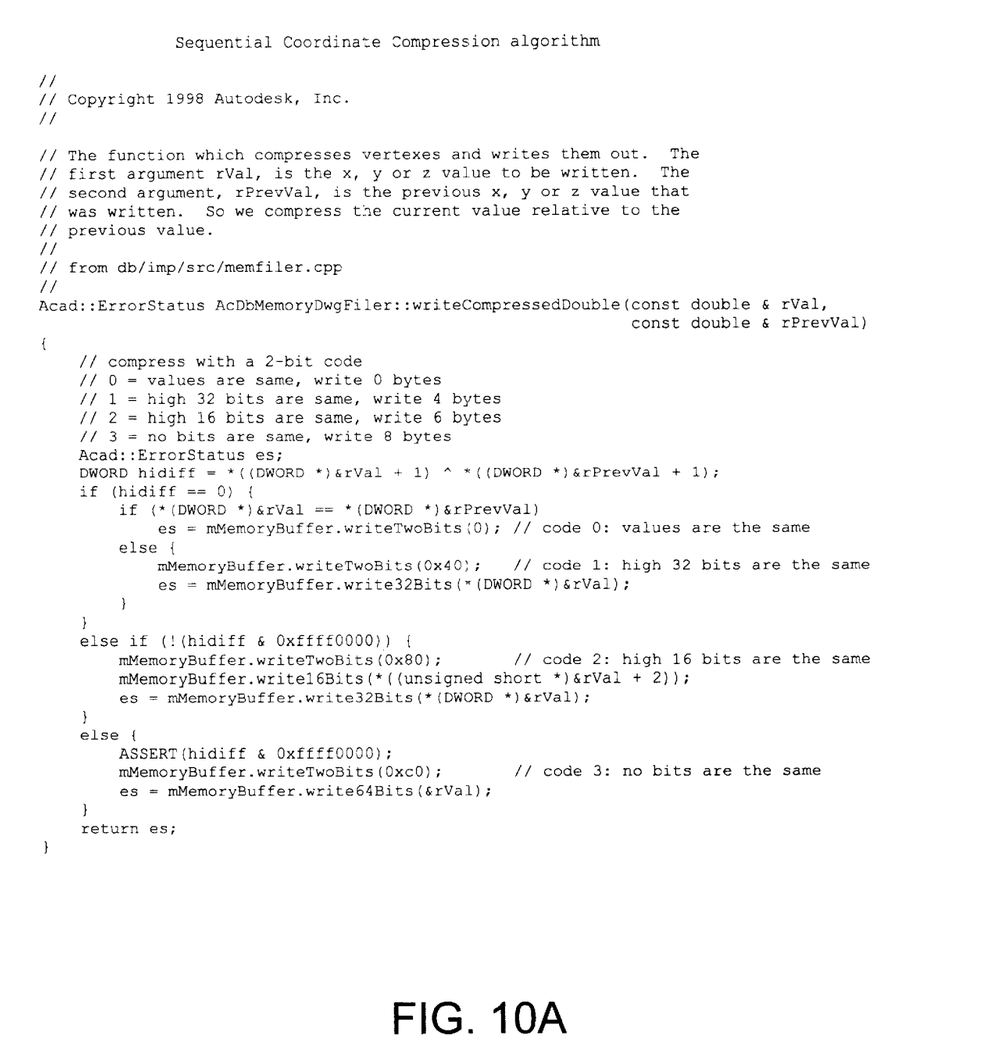
FIGS. 10A–10C are diagrams showing exemplary source code for the sequential coordinate compression algorithm.
Figure 10B:
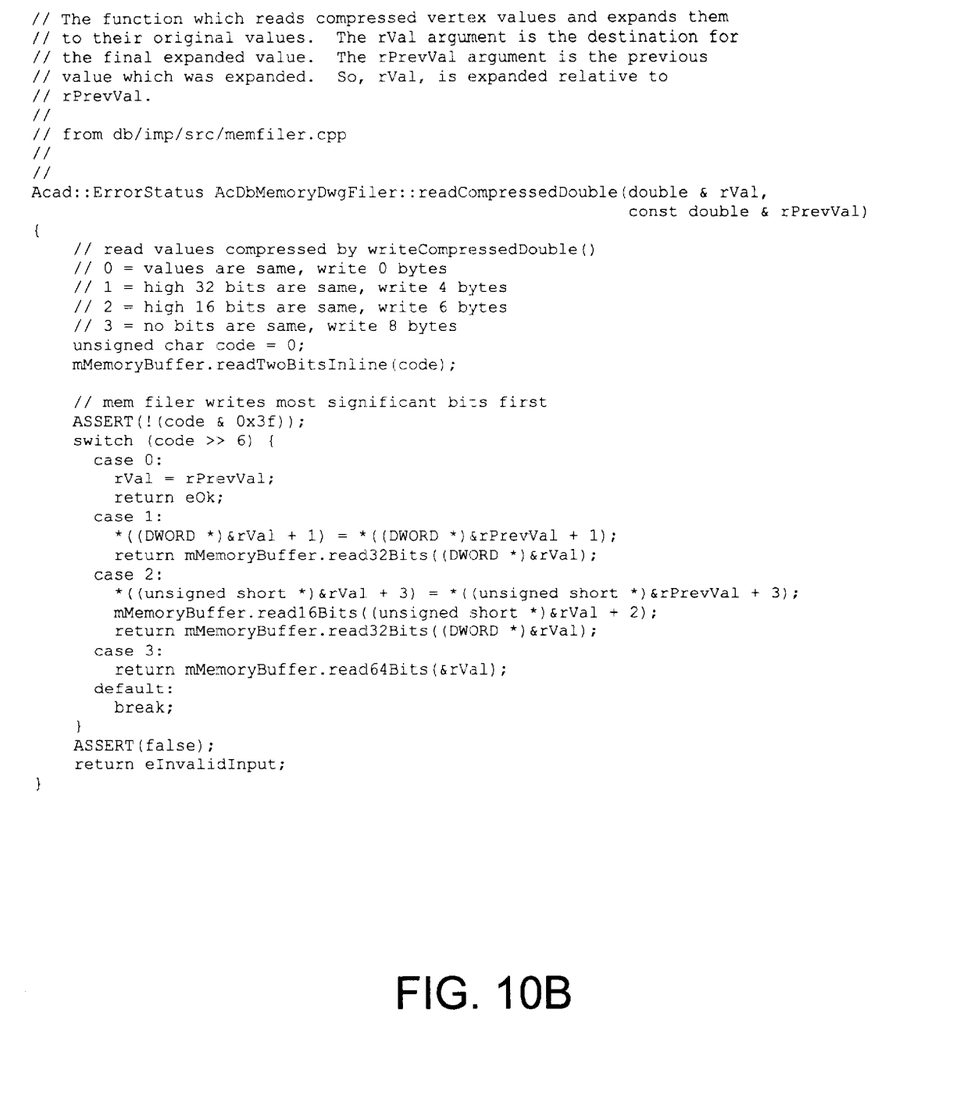
Figure 10C:
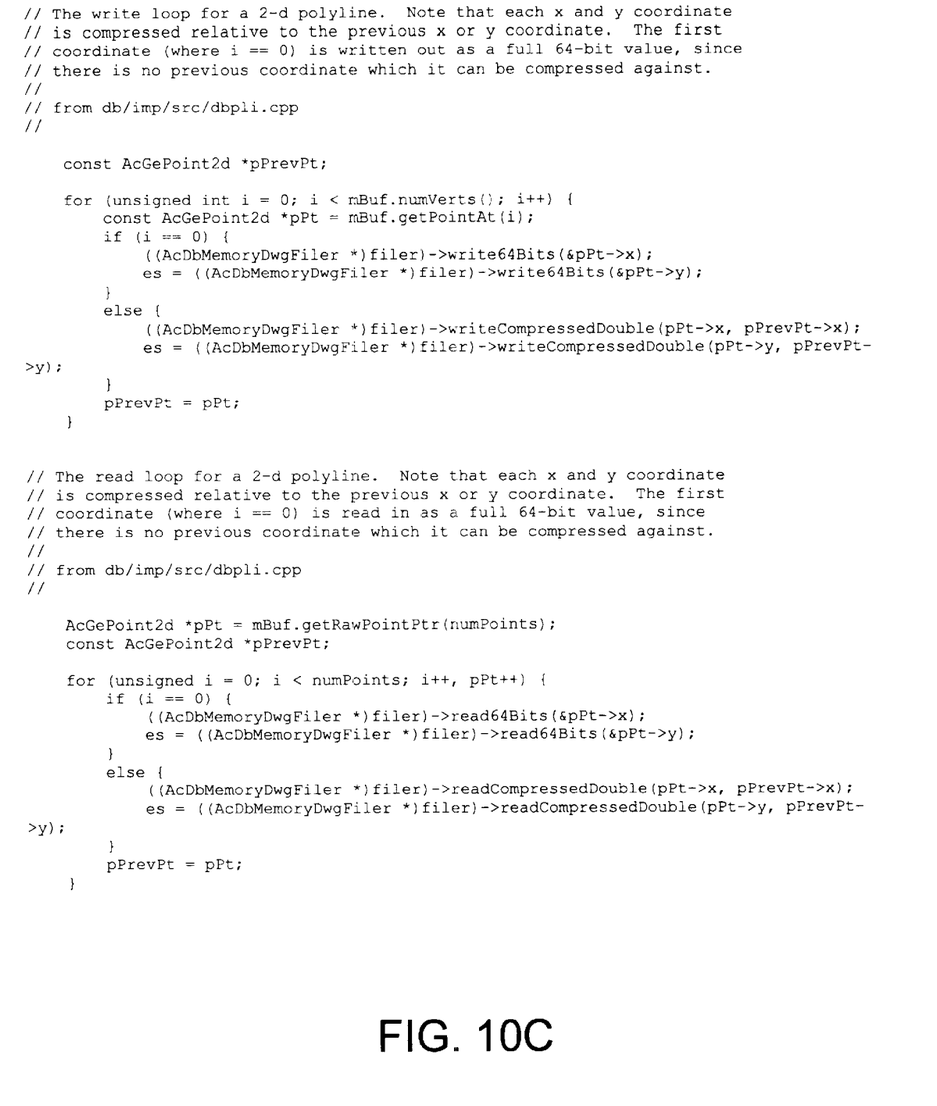

FIGS. 10A–10C are flow charts showing representative source code for performing the sequential compression algorithm described above.

Conclusion

This concludes the description of the preferred embodiments of the present invention. In summary, the present invention describes a method, apparatus, and article of manufacture for compressing data values representable by a plurality of digits.

The method begins by segmenting a first data value into common digits and non-common digits. The common digits are the digits in the first data value that have the same value as the corresponding digits in a second data value (typically, the data value preceding the first data value). A code identifying the common digits is then generated, and stored along with the common digits for later retrieval. This represents the compressed first data value.

The compressed data is decompressed by performing the steps of reading the compressed data value and the code (which identifies the digits that are common between the first data value and a second data value), and substituting the digits common between the first data value and the second data value according to the code.

The apparatus comprises means for performing the method steps described above. In each case, the means for performing these steps may include, for example a computer, a special purpose processor, or a combination of computers connected via an intranet, the Internet, or similar communication path. The article of manufacture comprises a data storage device tangibly embodying instructions to perform the method steps described above.

The foregoing description of the preferred embodiment of the invention has been presented for the purposes of illustration and description. It is not intended to be exhaustive or to limit the invention to the precise form disclosed. Many modifications and variations are possible in light of the above teaching.

For example, for purposes of illustration, the foregoing embodiment shows a case where the bits of the first data value and the second data value are organized from a most significant bit to a least significant bit. However, this organization is not required to practice the present invention. In some circumstances, it is beneficial to dynamically organize the digits differently to effect a minimum change from one data value in a series of data values to another next data value. Further, before applying the foregoing data compression technique, a series of data values can be reordered before compression so that the delta or change between each successive data values is minimized. If the order of the original series of numbers is important, a code indicating the order of each data point may be derived and stored as well.

It is intended that the scope of the invention be limited not by this detailed description, but rather by the claims appended hereto. The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A method of compressing a first data value represented by a plurality of digits, comprising the steps of:
    identifying common and non-common digits in the first data value, wherein the common digits comprise digits in the first data value that are equal to corresponding digits in a second data value and the non-common digits comprise digits in the first data value that are not equal to corresponding digits in the second data value; and
    forming a compressed data value from the non-common digits and a code identifying the common digits.

2. The method of claim 1, wherein the identifying step comprises the step of comparing the first data value to the second data value to identify a contiguous series of N digits in the first data value that have the same value as a corresponding series of N digits in the second data value.

3. The method of claim 2, wherein the plurality of digits of each data value are ordered in significance from a most significant digit to a least significant digit, and wherein the series of N digits begins at a most significant digit.

4. The method of claim 3, wherein the code indicates the number of contiguous digits in the first data value that have the same value as the corresponding contiguous digits in the second data value.

5. The method of claim 4, wherein the first data value and the second data value are members of a series of data values, and the second data value precedes the first data value in the series of data values.

6. The method of claim 5, wherein each of the plurality of digits is represented by a hexadecimal code.

7. A method of decompressing a compressed data value represented by a plurality of digits, comprising the steps of:
    reading a first compressed data value and a code identifying digits that are common between a first data value and a second data value, wherein the digits that are common between the first data value and the second data value comprise digits in the first data value that are equal to corresponding digits in the second data value;
    wherein the first compressed data value comprises non-common digits having digits in the first data value that are not equal to corresponding digits in the second data value; and
    substituting the digits common between the first data value and the second data value into the first compressed data value according to the code.

8. The method of claim 7, wherein:
    the plurality of digits of each data value are ordered in significance from a most significant digit to a least significant digit;
    the digits in the first compressed data value common to the second data value comprise a contiguous series of N digits beginning it the most significant digit.

9. The method of claim 7, wherein the first compressed data value is formed by performing the steps of:
    segmenting a first data value into common digits and non-common digits wherein the common digits comprise digits in the first data value that are equal to corresponding digits in the second data value and the non-common digits comprise digits in the first data value that are not equal to corresponding digits in the second data value; and
    forming the first compressed data value from the non-common digits and the code identifying the common digits.

10. The method of claim 9, wherein the segmenting step comprises the step of comparing the first data value to the second data value to identify a contiguous series of N digits in the first data value that have the same value as a corresponding series of N digits in the second data value.

11. A method of decompressing a compressed data value represented by a plurality of digits, comprising the steps of:
    reading a first compressed data value and a code identifying digits that are common between a first data value and a second data value, the first compressed data value and the code generated by performing the steps of identifying common and non-common digits in the first data value, wherein the common digits comprise digits in the first data value that are equal to corresponding digits in a second data value, and the non-common digits comprise digits in the first data value that are not equal to corresponding digits in the second data value, and forming a compressed data value from the non-common digits and a code identifying the common digits; and
    substituting the digits common between the first data value and the second data value into the first compressed data value according to the code.

12. An apparatus for compressing a first data value represented by a plurality of digits, comprising:
    means for identifying common and non-common digits in the first data value, wherein the common digits comprise digits in the first data value that are equal to corresponding digits in a second data value, and the non-common digits comprise digits in the first data value that are not equal to corresponding digits in the second data value; and
    means for forming a compressed data value from the non-common digits and a code identifying the common digits.

13. The apparatus of claim 12, wherein the means for identifying common and non-common digits in the first data value comprises means for comparing the first data value to the second data value to identify a contiguous series of N digits in the first data value that have the same value as a corresponding series of N digits in the second data value.

14. The apparatus of claim 13, wherein the plurality of digits of each data value are ordered in significance from a most significant digit to a least significant digit, and wherein the series of N digits begins at a most significant digit.

15. The apparatus of claim 14, wherein the code indicates the number of contiguous digits in the first data value that have the same value as the corresponding contiguous digits in the second data value.

16. The apparatus of claim 15, wherein the first data value and the second data value are members of a series of data values, and the second data value precedes the fist data value in the series of data values.

17. The apparatus of claim 16, wherein each of the plurality of digits is represented by a hexadecimal code.

18. An apparatus for decompressing a compressed data value represented by a plurality of digits, comprising:
   means for reading a first compressed data value and a code identifying digits that are common between a first data value and a second data value, wherein the digits that are common between the first data value and the second data value comprise digits in the first data value that are equal to corresponding digits in the second data value;
   wherein the first compressed data value comprises non-common digits having digits in the first data value that are not equal to corresponding digits in the second data value; and
   means for substituting the digits common between the first data value and the second data value into the first compressed data value according to the code.

19. The apparatus of claim 18, wherein:
   the plurality of digits of each data value are ordered in significance from a most significant digit to a least significant digit;
   the digits in the first compressed data value common to the second data value comprise a contiguous series of N digits beginning at the most significant digit.

20. The apparatus of claim 18, wherein the first compressed data value comprises:
   common digits and non-common digits, wherein the common digits comprise digits in the first data value that are equal to corresponding digits in the second data value and the non-common digits comprise digits in the first data value that are not equal to corresponding digits in the second data value; and
   a code identifying the common digits.

21. The apparatus of claim 20, wherein the common and non-common digits are segmented by comparing the first data value to the second data value to identify a contiguous series of N digits in the first data value that have the same value as a corresponding series of N digits in the second data value.

22. A program storage device, readable by a computers tangibly embodying at least one program of instructions executable by the computer to perform method steps of compressing a first data value represented by a plurality of digits, the method comprising the steps of:
   identifying common and non-common digits in the first data value, wherein the common digits comprise digits in the first data value that are equal to corresponding digits in a second data value, and the non-common digits comprise digits in the first data value that are not equal to corresponding digits in the second data value; and
   forming a compressed data value from the non-common digits and a code identifying the common digits.

23. The program storage device of claim 22, wherein the identifying step comprises the a method step of comparing the first data value to the second data value to identify a contiguous series of N digits in the first data value that have the same value as a corresponding series of N digits in the second data value.

24. The program storage device of claim 23, wherein the plurality of digits of each data value are ordered in significance from a most significant digit to a least significant digit, and wherein the series of N digits begins at a most significant digit.

25. The program storage device of claim 24, wherein the code indicates the number of contiguous digits in the first data value that have the same value as the corresponding contiguous digits in the second data value.

26. The program storage device of claim 25, wherein the first data value and the second data value are members of a series of data values, and the second data value precedes the first data value in the series of data values.

27. The program storage device of claim 26, wherein each of the plurality of digits is represented by a hexadecimal code.

28. A program storage device, readable by a computer, tangibly embodying at least one program of instructions executable by the computer to perform method steps of decompressing a compressed data value represented by a plurality of digits, the method comprising the steps of:
   reading a first compressed data value and a code identifying digits that are common between a first data value and a second data value, wherein the digits that are common between the first data value and the second data vial comprise digits in the first data value that am equal to corresponding digits in the second data value;
   wherein the first compressed data value comprises non-common digits having digits in the first data value that are not equal to corresponding digits in the second data value; and
   substituting the digits common between the first data value and the second data value into the first compressed data value according to the code.

29. The program storage device of claim 28, wherein:
   the plurality of digits of each data value are ordered in significance from a most significant digit to a least significant digit;
   the digits in the first compressed data value common to the second data value comprise a contiguous series of N digits bemusing at the to significant digit.

30. The program storage device of 28, wherein the first compressed data value is formed by performing the steps of:
   segmenting a first data value into common digits and non-common digits wherein the common digits comprise digits in the first data value that are equal to corresponding digits in the second data value and the non-common digits comprise digits in the first data value that are not equal to corresponding digits in the second data value; and
   forming the first compressed data value front the non-common digits ad the code identifying the common digits.

31. The program storage device of claim 30, wherein the segmenting step comprises the step of comparing the first data value to the second data value to identify a contiguous series of N digits in the first data value that have the same value as a corresponding series of N digits in the second data value.

* * * * *

UNITED STATES PATENT AND TRADEMARK OFFICE
CERTIFICATE OF CORRECTION

PATENT NO.    : 6,396,420 B1
DATED         : May 28, 2002
INVENTOR(S)   : Davis C. Augustine It is certified that error appears in the above-identified patent and that said Letters Patent is hereby corrected as shown below:

<u>Title page,</u>
Item [57], ABSTRACT,
Line 2, "describe" should read -- described --

<u>Column 8,</u>
Line 17, "it" should read -- at --

<u>Column 9,</u>
Line 56, after "a", "computers" should read -- computer --

<u>Column 10,</u>
Line 4, after "the" strike "a"
Line 33, "vial" should read -- value --
Line 33, "am" should read -- are --
Line 47, "bemusing" should read -- beginning --
Line 47, "to" should read -- most --
Line 57, "front" should read -- from --
Line 58, "ad" should read -- and --

Signed and Sealed this

Twenty-fourth Day of June, 2003

JAMES E. ROGAN
*Director of the United States Patent and Trademark Office*